US009408284B2

(12) United States Patent
Kow

(10) Patent No.: US 9,408,284 B2
(45) Date of Patent: Aug. 2, 2016

(54) TEST PIN ARRAY WITH ELECTROSTATIC DISCHARGE PROTECTION

(75) Inventor: Kek Hing Kow, Guangdong (CN)

(73) Assignee: ESD TECHNOLOGY CONSULTING & LICENSING CO., LTD, Shenzhen (CN)

( * ) Notice: Subject to any disclaimer, the term of this patent is extended or adjusted under 35 U.S.C. 154(b) by 308 days.

(21) Appl. No.: 14/238,847

(22) PCT Filed: Aug. 16, 2011

(86) PCT No.: PCT/CN2011/078479
§ 371 (c)(1),
(2), (4) Date: Feb. 14, 2014

(87) PCT Pub. No.: WO2013/023360
PCT Pub. Date: Feb. 21, 2013

(65) Prior Publication Data
US 2014/0204500 A1   Jul. 24, 2014

(51) Int. Cl.
H01H 47/00   (2006.01)
H05F 3/00    (2006.01)
H01L 23/60   (2006.01)
G01R 1/36    (2006.01)
G01R 1/067   (2006.01)
G01R 1/04    (2006.01)
G01R 1/18    (2006.01)

(52) U.S. Cl.
CPC *H05F 3/00* (2013.01); *G01R 1/067* (2013.01); *G01R 1/36* (2013.01); *H01L 23/60* (2013.01); *G01R 1/0466* (2013.01); *G01R 1/18* (2013.01); *H01L 2924/0002* (2013.01)

(58) Field of Classification Search
CPC ........................................................ H05F 3/00
USPC .............................................................. 361/220
See application file for complete search history.

(56) References Cited

U.S. PATENT DOCUMENTS

| 7,253,648 | B2 * | 8/2007  | Yang  | G01R 1/06788 324/754.07 |
| 8,310,259 | B2 * | 11/2012 | Hamel | G01R 31/2889 324/750.28 |
| 9,252,593 | B2 * | 2/2016  | Wang  | H02H 9/046 |

FOREIGN PATENT DOCUMENTS

| MY | 2010004975 | 10/2010 |
| WO | 2010143932 | 12/2010 |

* cited by examiner

*Primary Examiner* — Stephen W Jackson

(57) ABSTRACT

A test pin array (21) array with electrostatic discharge protection comprises at least one modified test pin (22) with a static dissipative element (24) incorporated at its plunger tip (23). The use of the modified test among the test pin array provides an extremely low-cost alternative solution to the large scale testing of microchips without the use of any air ionizer.

9 Claims, 2 Drawing Sheets

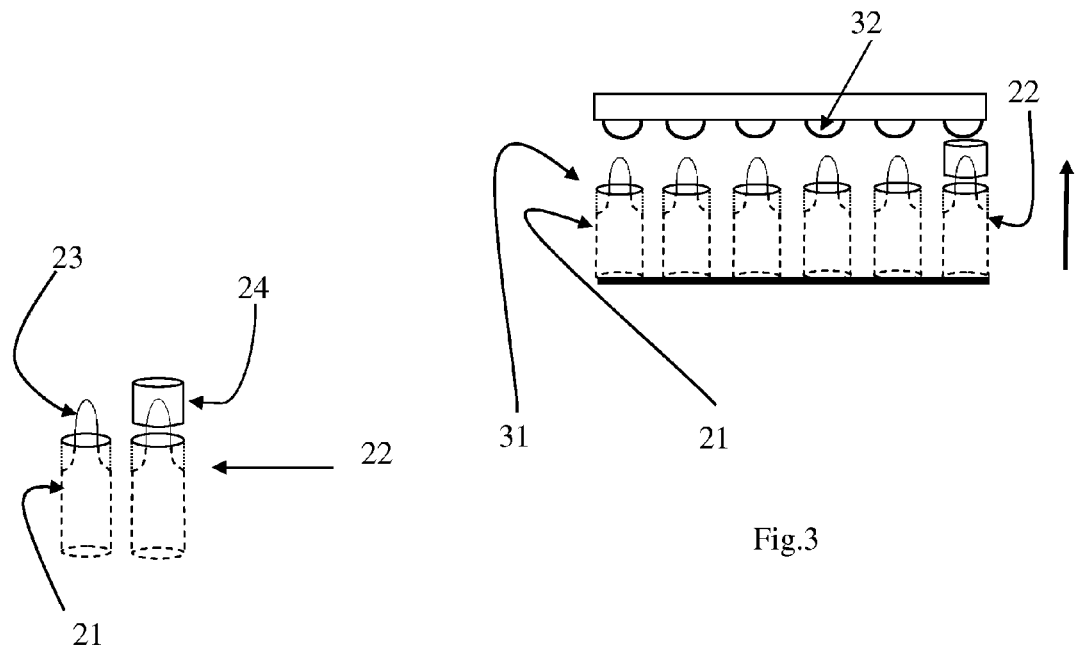
Fig.3
Fig.2
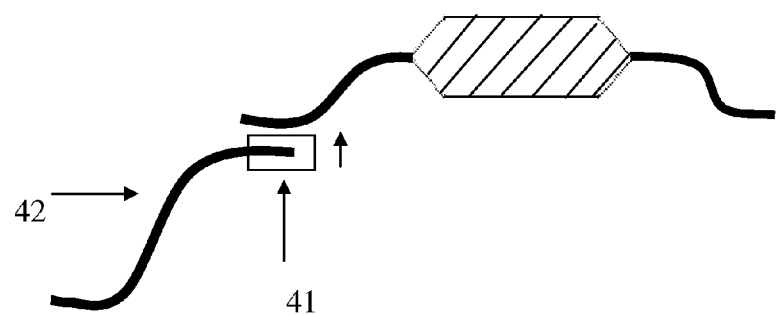
Fig.4

TEST PIN ARRAY WITH ELECTROSTATIC DISCHARGE PROTECTION

FIELD OF THE INVENTION

The present invention relates to static charge reduction technique, and, more specific, to a test pin array with electrostatic discharge protection.

BACKGROUND OF THE INVENTION

The importance of electrostatic discharge (ESD) control in today's micro-electronics is already a well known fact and deserves the priority attention for all manufacturers of microchips. Much care is being taken in the manufacturing and handling of electrostatic discharge sensitive components with the objective to eliminate electrostatic discharge. People, equipments and materials have to be properly grounded to discharge harmful static charge that may reside on every people, equipments or materials.

A typical microchip test system in the market as shown in FIG. 1 consists of a test pin array 11, aligned at the correct position below the test socket, having the test pin array 12 penetrate through the test holes of the socket, rest on the appropriate test leads or test points 13 of the microchip and then start the microchip testing.

To reduce the amount of static charge generation of the microchip, it is common to find more and more ionizers are being used in its design to counter the threat of ESD. At the microchip test point, ionizer or ionizers are often installed at strategic location(s) to neutralise any static charge that may be lurking around the pick-up and shuttle area and those reside on the body of a microchip prior to testing.

While it is common to use such ionisation technique in the prevention of ESD, there are several shortcomings encountered in a typical semiconductor manufacturing environment.

Firstly, in a large scale implementation, it involves high cost of investment. Not only high investment is needed in the purchase of high reliability ionizers, it also incur high maintenance cost in the regular checks, periodical calibrations, repair (especially after warranty period) and many other hidden cost like record keeping, human resources required and the provision of production space, etc.

Secondly, they are performance limitations in the use of the ionizer(s) installed around at the testing point of a test handler.

a) Neutralisation time is too slow in today's high speed and high output test handlers. Static decay time of an ionizer drop significantly over time of usage due to unavoidable accumulation of ammonium compound substance deposited at the needle tips of the ionizer in the presence of natural nitrogen (N2) and moisture (H2O) in the air. Effectiveness of an air ionizer will lost if the sharpness of the needle tip is lost. Therefore cleaning of the needle tips regularly inside the test handler in order to maintain the reliable performance of an ionizer is extremely difficult and cumbersome in today's highly compact test handler design.

b) Certain level of skill is required for the productive use of ionizer like good understanding of the air flow characteristic, positioning, re-positioning after servicing and the influence of conductive material along the flow path of the ionized air, etc. All these will directly affect the performance of an ionizer. In reality, investment must be put in to train technician or engineer with proper skill & practical knowledge in order to handle air ionizers productively.

One skilled in the art may figure out an alternative solution based on the use of static dissipative material in the fabrication of the test socket to eliminate the ESD threat. However, such technique may raise the concern for the presence of leakage current which can affect the accuracy and reliability of the testing process in many today's highly ESD-sensitive microchips.

PCT application no. PCT/MY2009/00072 and patent application no. PI2010004975 offer alternative solutions replacing the use of ionizers in the combat against the ESD threat.

However, these solutions possess limitations in many real-life situations:

Firstly, many tiny microchip designs are difficult to fabricate due to too fine the geometry thus requires high investment in high precision tooling and expensive machine set-up.

Secondly, such difficulty further aggravated by the miniaturisation trend of the microchips in today's rapid product innovation towards smaller but higher performance devices.

Therefore, there is a need for further research and development work to eliminate or overcome the above shortcomings of the prior art.

SUMMARY OF THE INVENTION

The primary objective of this invention is to provide a test pin array with electrostatic discharge protection, which comprises a uniquely modified test pin or probe pin in a microchip testing process to effectively drain static charge safely from the microchip to ground.

The test pin array with electrostatic discharge protection according to present invention comprises at least one modified test pin with a static dissipative element incorporated at its plunger tip.

Preferably, the static dissipative element is an add-on structure capped onto the plunger tip in the at least one modified test pin.

Preferably, the static dissipative element is a layer of static dissipative material coated at the plunger tip in the at least one modified test pin.

Preferably, the plunger tip in the at least one modified test pin is made from the static dissipative element.

Preferably, static dissipative value of static dissipative material made of the static dissipative element is in the range of 10e4 to 10e11 ohms, preferably 10e5 to 10e9, more preferably 10e6 to 10e8 when measured according to the ESD Association Test Method ANSI/ESD 11.11 (USA).

Preferably, the at least one modified test pin is always slightly above other test pins in the test pin array, so that the at least one modified test pin is the one to touch a corresponding contact point of a microchip first thereby discharging residue static charge of the microchip before the other test pins touches their corresponding contact points of the microchip.

Preferably, the at least one modified test pin is arranged along any perimeter edge of the test pin array.

Preferably, the at least one modified test pin touches a ground test point of a microchip or touches any other test point linking to the ground test point of the microchip.

When the test pin array starts to move upwards to electrically engage with the test pin contact points of the microchip, the at least one modified test pin with a static dissipative element incorporated at its plunger tip always is the one to touch the contact point first thereby discharging the residue static charge of the microchip before other test pins touches the contact points.

Such technique of discharging the static charge will achieve the following advantages compared to the cited prior arts, such as a simpler design required less precision engineering tooling and set-up, cheaper to fabricate and faster to produce.

The use of a modified test pin among the test pin array provides an extremely low-cost alternative solution to the large scale testing of microchips without the use of any air ionizer.

BRIEF DESCRIPTION OF THE DRAWINGS

So as to further explain the invention, an exemplary embodiment of the present invention will be described with reference to the below drawings, wherein:

FIG. 2 shows an original test pin and a modified test pin;

FIG. 3 shows a modified test pin touches the test point first before other pins do;

FIG. 4 shows another type of microchip design package touches a modified test finger of the test socket.

DETAILED DESCRIPTION OF THE PREFERRED EMBODIMENT

Figure 1:
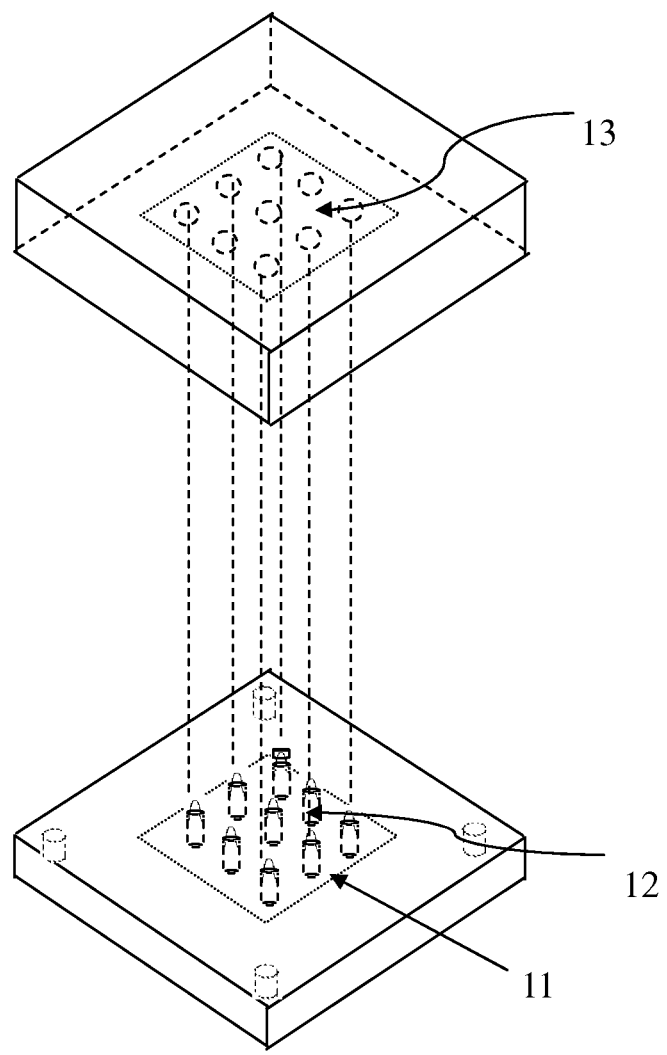
FIG. 1 shows a brief schematic diagram of the test socket and microchip prior to engage for testing.

These and other advantage, aspect and novel features of the present invention, as well as details of an illustrated embodiment thereof will be more fully understood from the following description and drawings, while various embodiments of the present invention are presented by way of examples only, not limitation.

The invention disclosed herewith relates to a test pin array (called as a probe pin array in some occasions) comprises a modified test pin or probe pin in a typical microchip testing operations. The modified test pin or probe pin must possess or be modified to possess permanent static dissipative property at the plunger tip. The plunger tip can be made of static dissipative material, static dissipative material coated or an add-on static dissipative material, etc. The physical modification of the plunger tip can be in any shape or configurations.

FIG. 2 shows an original test pin 21 and a modified test pin 22. The modified test pin 22 has a static dissipative element 24 incorporated at its plunger tip 23. As shown in FIG. 2, the static dissipative element 24 is a rod-shape static dissipative material with a simple machine work of making a tiny centre hole along at the centre axis of the rod and capped onto the plunger tip 23 of the modified test pin 22. Of course, in other embodiment, the static dissipative element 24 can be in any other shape, such as square, rectangle, diamond, or other regular or irregular shapes, or in other configurations, such as surrounding the plunger tip, coating the plunger tip, or mounting on the top of the plunger tip. One skilled in the art may design the static dissipative element according the actual applications such that the modified test pin is the one to touch a corresponding contact point of a microchip first thereby discharging residue static charge of the microchip before the other test pins touches their corresponding contact points of the microchip.

In other embodiment, the static dissipative element 24 can be a layer of static dissipative material coated at the plunger tip in the at least one modified test pin. In another embodiment, the plunger tip in the at least one modified test pin is made from the static dissipative element. The static dissipative value of the static dissipative material used in the static dissipative element is in the range of 10e4 to 10e11 ohms, preferably 10e5 to 10e9 ohms, more preferably 10e6 to 10e8 ohms when measured according to the ESD Association Test Method ANSI/ESD 11.11 (USA).

The modified test pin 22 is preferably a test pin that touches the ground test point of a microchip or touches any other test point (or test points) linking to the ground test point of the microchip.

Optionally, the size of the modified test pin 22 is made bigger than the rest of the test pin in the test pin array to take advantage of the cost and ease of fabrication. The location of the modified test pin 22 is selected along any perimeter edge of the test pin array so that it has more space for easier fabrication and less obstruction to an adjacent test pin during the mechanical movement of the testing process. Of course, the modified test pin 22 can also be positioned anywhere inside or around the vicinity of the test pin array as long as space or engineering fabrication capability permits.

Although the present invention only discloses examples that the test pin array has one modified test pin, one skilled in the art knows that the test pin array can have more than one modified test pins arranged along the perimeter edges of the test pin array or anywhere else of the test pin array.

It is important and critical that the modified test pin in this invention must be fabricated and positioned in such a way that its plunger tip is always slightly above the rest of the test pins.

FIG. 3 shows a modified test pin touches the test point first before other pins do. When the test pin array 31 starts to move upwards to electrically engage with the test pin contact points 32 of the microchip, the slightly protruded modified test pin 22 always is the one to touch the contact point 32 first thereby discharging the residue static charge of the microchip before other test pins 21 touches the contact points 32 as shown in FIG. 3.

Wherein, the modified test pin 22 is a test pin that touches the ground test point of a microchip or touches any other test point (or test points) linking to the ground test point of the microchip.

Such technique of discharging the static charge will achieve the following advantages compared to the cited prior arts, such as a simpler design required less precision engineering tooling and set-up, cheaper to fabricate, faster to produce.

Similarly, the same method of having the modified test pin 41 touched the test point first before other pins touch can be used in another microchip testing process using test fingers 42 as illustrated in FIG. 4. The scope and spirit of the invention is the same.

In conclusion, the use of a modified test pins positioned slightly higher than the rest of the test pins in the current invention provides an extremely low-cost alternative solution to the large scale testing of microchips without the use of any air ionizer.

While the present invention has been described with reference to several embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A test pin array with electrostatic discharge protection, wherein, comprises at least one modified test pin with a static dissipative element incorporated at its plunger tip; wherein the at least one modified test pin is always slightly above other test pins in the test pin array, so that the at least one modified test pin is the one to touch a corresponding contact point first thereby discharging residue static charge of a microchip before the other test pins touches their corresponding contact points.

2. The test pin array with electrostatic discharge protection according to claim 1, wherein, the static dissipative element is an add-on structure capped onto the plunger tip in the at least one modified test pin.

3. The test pin array with electrostatic discharge protection according to claim 1, wherein, the static dissipative element is a layer of static dissipative material coated at the plunger tip in the at least one modified test pin.

4. The test pin array with electrostatic discharge protection according to claim 1, wherein, the plunger tip in the at least one modified test pin is made from the static dissipative element.

5. The test pin array with electrostatic discharge protection according to claim 1, wherein, static dissipative value of static dissipative material made of the static dissipative element is in the range of 10e4 to 10e11 ohms.

6. The test pin array with electrostatic discharge protection according to claim 5, wherein, static dissipative value of static dissipative material made of the static dissipative element is in the range of 10e5 to 10e9 ohms.

7. The test pin array with electrostatic discharge protection according to claim 6, wherein, static dissipative value of static dissipative material made of the static dissipative element is in the range of 10e6 to 10e8 ohms.

8. The test pin array with electrostatic discharge protection according to claim 1, wherein, the at least one modified test pin is arranged along any perimeter edge of the test pin array.

9. The test pin array with electrostatic discharge protection according to claim 1, wherein, the at least one modified test pin touches a ground test point of a microchip or touches any other test point linking to the ground test point of the microchip.

* * * * *